(12) United States Patent
Ishikawa

(10) Patent No.: US 6,618,068 B2
(45) Date of Patent: Sep. 9, 2003

(54) PRINTER DEVICE

(75) Inventor: Kazuhide Ishikawa, Mitaka (JP)

(73) Assignee: Olympus Optical Co., Ltd., Tokyo (JP)

( * ) Notice: Subject to any disclaimer, the term of this patent is extended or adjusted under 35 U.S.C. 154(b) by 0 days.

(21) Appl. No.: 09/804,274

(22) Filed: Mar. 12, 2001

(65) Prior Publication Data

US 2002/0158962 A1 Oct. 31, 2002

(30) Foreign Application Priority Data

Mar. 14, 2000 (JP) ........................................ 2000-069928

(51) Int. Cl.[7] .............................. B41J 17/00; B41J 2/325
(52) U.S. Cl. ...................................................... 347/215
(58) Field of Search ............................. 347/215, 222.2, 347/197, 55, 171; 400/693, 120.13, 120.01, 582, 223, 578

(56) References Cited

U.S. PATENT DOCUMENTS

| | | | | |
|---|---|---|---|---|
| 5,024,541 A | * | 6/1991 | Tsukada et al. | 400/693 |
| 5,110,226 A | * | 5/1992 | Sherman et al. | 347/109 |
| 5,475,403 A | * | 12/1995 | Havlovick et al. | 346/134 |
| 5,778,347 A | * | 7/1998 | Hetzer | 101/425 |
| 5,917,533 A | * | 6/1999 | Suzuki et al. | 347/214 |
| 6,367,693 B1 | * | 4/2002 | Novogrod | 235/379 |

FOREIGN PATENT DOCUMENTS

| | | |
|---|---|---|
| JP | 3114348 | 11/1991 |
| JP | 11157113 | 6/1999 |

* cited by examiner

*Primary Examiner*—Lamson Nguyen
*Assistant Examiner*—K. Feggins
(74) *Attorney, Agent, or Firm*—Volpe and Koening, P.C.

(57) ABSTRACT

A compact and lightweight design for a printer device that is optimally portable. A printed circuit board assembly 22 incorporated in the printer device includes a control printed-circuit board 22*a* and a power printed-circuit board 22*b* arranged substantially in L-shaped fashion. A connector 23 electrically couples boards 22*a* and 22*b* to each other. The power printed-circuit board, on which large current flows, is located near a large current source. A charge circuit, battery contacts and a control circuit for applying voltage to a thermal head are mounted and concentrated on the sole power printed-circuit board. The control printed-circuit board 22*a* for controlling recording paper and ink ribbon feed, which require only small current, is located near a small current source, such as an actuator needed for feeding recording paper and an ink ribbon including a recording paper/ribbon feeding mechanism 17. The circuits for controlling recording paper feed and ink ribbon feed are mounted and concentrated on the sole control printed-circuit board 22*a*. The substantially L-shaped printed-circuit board assembly, serving as a motherboard, is incorporated in the printer device to realize the capabilities of the printer device.

9 Claims, 6 Drawing Sheets

PRINTER DEVICE

This application claims benefit of Japanese Application No. 2000-69928 filed in Japan on Mar. 14, 2000, the contents of which are incorporated by this reference.

BACKGROUND OF THE INVENTION

1. Field of the Invention

The present invention relates to a printer device, or more particularly, to a printer device that is so compact and lightweight as to be portable.

2. Description of Related Art

Personal computers and video recorders have been popular in recent years. Various types of printer devices capable of recording images produced by equipment including the personal computer and video recorder have been proposed, and the needs for printer devices have increased. There is therefore an increasing demand for a printer device that is inexpensive and capable of producing high-definition print images. Moreover, a portable printer device that is compact and lightweight is highly demanded along with the needs for a mobile printer device that permits printing at any time in any place.

In a typical thermal printer device, a color hard-copy ink sheet having three dyes of yellow (Y), magenta (M) and cyan (C) cyclically applied thereto in predetermined order is circulated based on a video signal sent from an information source. A thermal head is heated in order to sublimate the dyes on the ink sheet. Thus, one screen image is printed in colors on recording paper (thermal transfer recording paper). Moreover, in the printer device, the length of time during which current is fed to the thermal head is controlled in order to adjust the amounts of dyes to be sublimated. Gray scaling is thus controlled. After an image is recorded in this way, a recording paper transporting mechanism included in the printer device transports recorded recording paper, and feeds it to and stores it in, for example, a finished paper case. Thus, a recording process for one screen image (one page) is completed.

Even the above type of thermal printer device is demanded to be so compact and lightweight as to be portable. As a related art, a printer device has been proposed in Japanese Unexamined Patent Publication No. 11-157113.

In the proposed printer device, an ink ribbon having thermal transfer inks applied to a thin film and recording paper are transported while being pressed by a thermal head and a platen roller. Current is then fed to an exothermic resistor included in the thermal head, thus heating the exothermic resistor. The exothermic resistor transfers the thermal transfer inks on the ink ribbon onto the recording paper, whereby printing is achieved. The printer device is characterized in that a thermistor is used to measure temperature for the purpose of setting the next printing start time instant. Thus, the printer device is readily realized as a compact printer device having the features that the thermal head enjoys excellent beat efficiency and sheets of recording paper can be printed successively.

Moreover, the thermal head employed in the printer device includes a bar-like glass member that is attached along one edge of a printed-circuit board. An exothermic unit including a plurality of exothermic resistors is formed along the bar-like glass member. The exothermic resistors are connected to a plurality of independent electrodes and a common electrode. A thermistor connected to the common electrode and a plurality of driving ICs connected to each of the plurality of independent electrodes and the common electrodes are mounted on the printed-circuit board. Consequently, power consumed by the thermal head can be set to a small value. Besides, a radiating plated employed in the related art becomes unnecessary. Therefore, the thermal head can be adapted to a printer device that is so compact and lightweight as to be portable.

For realizing a portable printer device, it is, as already known, important to design the printer device to be compact and lightweight. Another important factor for realizing a portable printer device is whether the printer device can be driven for printing using only a battery as well as an ac power line. Moreover, it would be found user-friendly if a charge circuit for charging the battery is incorporated in the printer device.

The improved printing performance of the conventional printer device and the compact and lightweight design thereof have been attained by improving the thermal head and obviating the necessity of the radiating plate. No description has been made of where a circuit-printed board should be placed in practice or how circuit elements should be mounted on the circuit-printed board in practice in order to attain the compact and lightweight design of the entire printer device. This poses a problem in that the printer device cannot be designed fully compactly. Moreover, the battery that is an important component of a portable printer device and the charge circuit for charging the battery are not included in the conventional printer device. The conventional printer device therefore fails to satisfy users who want a portable printer device.

OBJECT OF THE INVENTION

Accordingly, an object of the present invention is to provide a printer device that is so compact and lightweight as to be optimally portable.

SUMMARY

A printer device in accordance with the present invention comprises a control printed-circuit board, a power printed-circuit board, and a coupling means. The control printed-circuit board is placed on the bottom of the printer device and includes a control circuit that controls at least one of a paper feed and an ink ribbon feed. The power printed-circuit board is placed along one side surface of the printer device, and includes a charge circuit that charges a rechargeable battery brought into contact with battery contact connected to the charge circuit. The coupling means electrically couples the control printed-circuit board to the power printed-circuit board.

According to the present invention, the control printed-circuit board including the control circuit that controls at least one of paper feed and ink ribbon feed is placed on the bottom of the printer device. The power printed-circuit board including the charge circuit is located along one side surface of the printer device. The charge circuit charges the rechargeable battery brought into contact with the power contacts connected to the charge circuit. The control printed-circuit board and the power printed-circuit board are electrically coupled to each other using the coupling means. Consequently, the printed-circuit boards and the placement of the printed-circuit boards are most suitable for the compact design of the printer device from a structural viewpoint.

DESCRIPTION OF THE PREFERRED EMBODIMENTS

An embodiment of the present invention will be described with reference to the drawings below.

Figure 1:
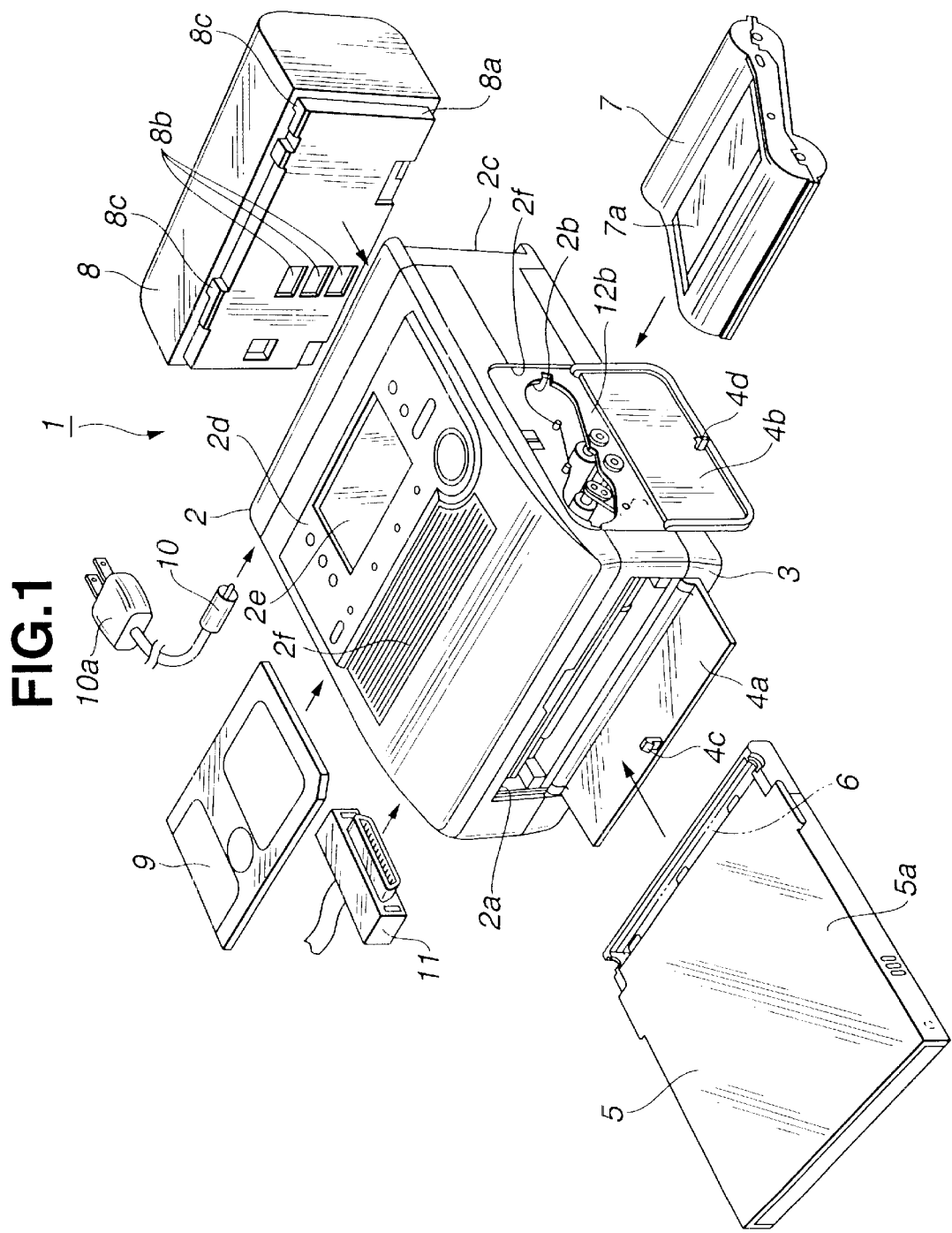
FIG. 1 is a perspective view showing the overall configuration of a printer device in accordance with an embodiment of the present invention.

FIG. 1 is a perspective view showing the overall configuration of a printer device in accordance with an embodiment of the present invention.

As shown in FIG. 1, the housing of a printer device 1 in accordance with the present embodiment consists of a body cover 2 and a body bottom 3. The body cover 2 encloses various mechanisms, components, and printed-circuit boards that are necessary for printing. The body bottom 3 is attached to the lower part of the body cover 2.

A paper feed cassette loading opening 2a through which a paper feed cassette 5 is loaded is formed in the front surface of the body cover 2 of the device 1 (left forward part of the drawing). A plurality of sheets of recording paper 6 can be stowed in the paper feed cassette loading opening 2a so that it can be unloaded freely.

Moreover, an open/close lid 4a capable of being opened and closed is shown in an open position on the body bottom 3 coincident with the position of the paper feed cassette loading opening 2a. The open/close lid 4a is closed to cover the paper feed cassette loading opening 2a after the paper feed cassette 5 is unloaded from the printer device. The open/close lid 4a has a locking means 4c that retains the closed state of the lid 4a. The open/close lid 4a is locked owing to the locking means 4c and a stopper means (not shown) located at a position on the body cover 2 coincident with the position of the locking means 4c.

An opening 2f is formed in the right side surface of the body cover 2 with the body cover 2 viewed from the front side of the printer device. A main frame 12b is exposed through the opening 2f and incorporated in the printer device. An ink cassette insertion port 2b through which an ink cassette 7 is inserted is formed in the main frame 12b. The ink cassette 7 has an ink ribbon 7a wound therein. The ink ribbon 7a has a plurality of thermal transfer inks applied repeatedly to a film-like base material. The thermal transfer inks of yellow (Y), magenta (M) and cyan (C) ink, and a transparent overcoat ink (OP) are applied to the film-like base material in that order (in order of the yellow, magenta, cyan, and overcoat inks).

Moreover, the body cover 2 has an open/close lid 4b capable of being opened or closed. The open/close lid 4b is closed to cover the opening 2f. Similarly to the open/close lid 4a, the open/close lid 4b has a locking means 4d that retains the closed state of the open/close lid 4b. The open/close lid 4b is locked owing to the locking means 4d and a stopper means (not shown) formed at a position on the body cover 2 coincident with the position of the locking means 4d.

A battery attachment groove 2c is formed in the back surface of the body cover 2 (right backward part of the drawing), and used to freely detachably attach a battery 8 to the body cover 2. The battery 8 serves as a driving power supplying means and is essential to a portable device. An attachment member 8a formed in the attachment surface of the battery 8 is fitted in the battery mounting groove 2c, whereby the battery 8 is attached to the body cover 2. Stoppers 8c formed on the top of the battery attachment member 8a are engaged with stopping means (not shown) formed at positions in the battery attachment groove 2c coincident with the positions of the stoppers 8c, whereby the attached state of the battery 8 can be retained.

Moreover, a plurality of battery contacts 8b is formed on the face of the attachment member 8a of the battery 8. Power accumulated in the battery 8 is supplied into the interior of the printer device 1 through the plurality of battery contacts 8b. When the battery 8 is fitted in the battery attachment groove 2c, the contacts 8b come into contact with battery contacts (not shown) formed on the back surface of the printer device 1, and conduct electricity to the battery contacts on the printer device 1. Thus, power is supplied to the interior of the printer device 1.

On the other hand, a memory card connector (not shown) is formed in the center of the side surface of the body cover 2 other than the side surface thereon in which the ink cassette insertion port 2b is formed. A memory card 9 in which an image information signal according to which an image is printed is recorded, for example, a smart medium is loaded through the memory card connector so that it can be unloaded freely. When the memory card 9 is loaded through the memory card connector (not shown), the image information signal needed to print an image is fetched from the memory card 9.

Moreover, a DC connector (not shown) is formed in the rear part of the same side surface. A DC plug 10 used to transform ordinary alternating voltage into direct voltage and apply the direct voltage to the printer device 1 is mated with the DC connector so that it can be unmated freely. The ordinary alternating voltage is applied through an AC plug 10a inserted into a mains outlet that is not shown. The alternating voltage is transformed into the direct voltage within the AC plug pr by an AC-to-DC transformer (not shown) interposed between the AC plug 10 and the DC plug 10. The resultant direct voltage is applied to the interior of the printer device as driving power for the printer device 1 through the DC plug 10.

In the printer device 1 in accordance with the present embodiment, an image information signal is fetched not only from the memory card 9 but also from, for example, a personal computer or video recording/reproducing equipment. Specifically, a PC connector (not shown) is formed in the frontal part of the side surface of the body cover 2 in which the memory card connector (not shown) is formed. A PC connecter 11 attached to a cable extending from the personal computer or video recording/reproducing equipment is mated with the PC connector (not shown) so that it can be unmated freely. In the printer device 1 in accordance with the present embodiment, various image information signals can be fetched not only from the memory card 9 but also through the PC connectors 11 attached to cables extending from various pieces of imaging equipment. This results in an expanded range of applications of the printer device.

Moreover, the paper feed cassette 5 employed in the printer device 1 can accommodate a plurality of sheets of recording paper 6. The paper feed cassette 5 has a detachable cover 5a as the top thereof. The cover 5a has a notch formed along the distal edge thereof included in the distal part of the paper feed cassette 5 that is inserted first. The topmost sheet of the plurality of sheets of recording paper 6 stowed in the paper feed cassette 5 is exposed through the notch. When the paper feed cassette 5 is inserted, the distal part of the paper feed cassette 5 is used to place the paper feed cassette 5 in position. A paper feed roller (not shown) located inside the printer device 1 comes into contact with one sheet of recording paper 6 exposed through the notch of the cover 5a. When the paper feed roller is driven to rotate, the one sheet of recording paper 6 is transported to the interior of the printer device without fail.

Next, the internal configuration of the printer device will be described with reference to FIG. 2.

Figure 2:
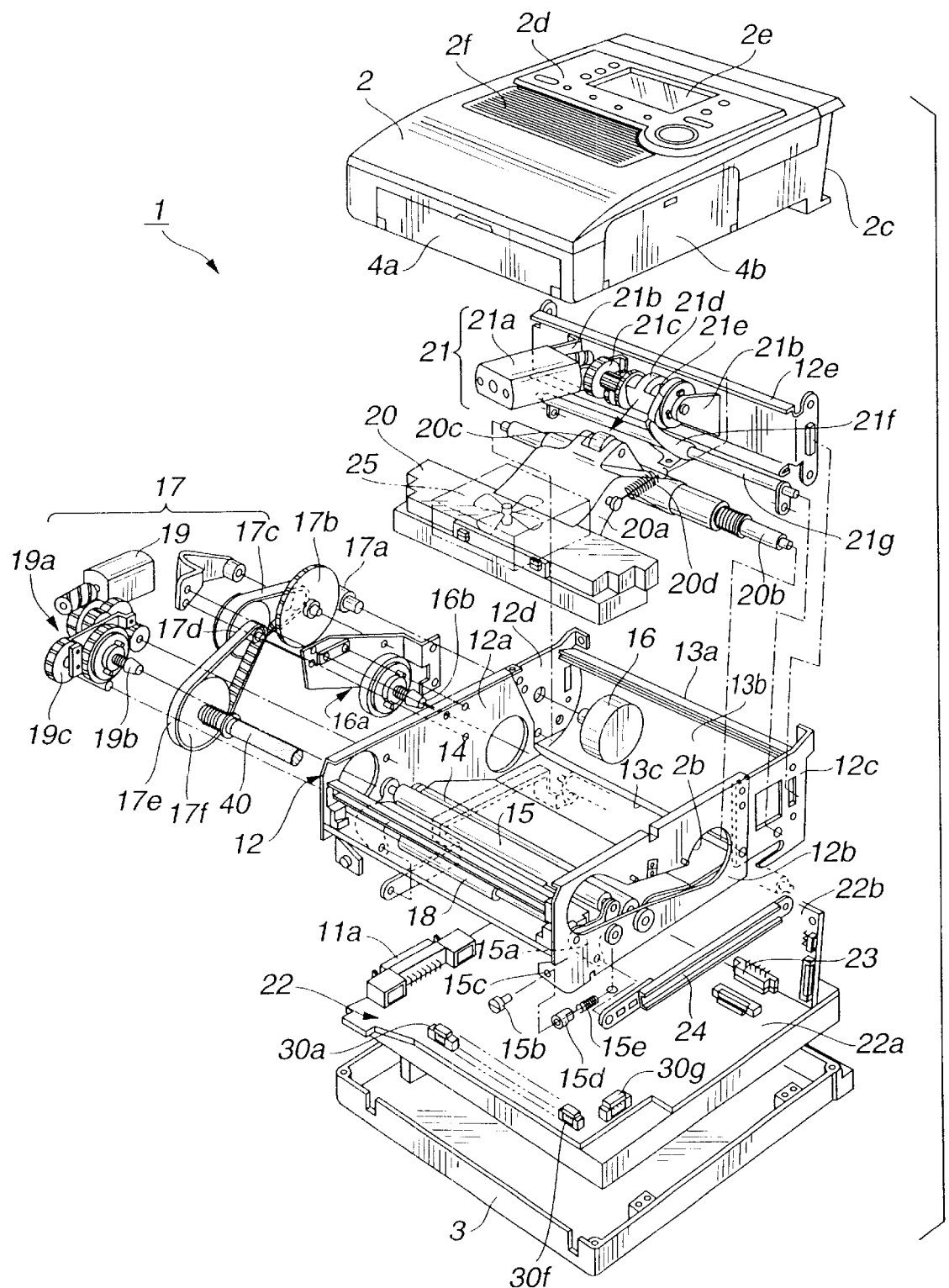
FIG. 2 is an exploded perspective view showing the internal configuration of the printer device shown in FIG. 1.

FIG. 2 is an exploded perspective view for explaining the internal configuration of the printer device shown in FIG. 1.

As shown in FIG. 2, the housing of the printer device 1 in accordance with the present invention determining the appearance of the printer device 1 is structured with the aforesaid combination of the body cover 2 and body bottom 3. The main frame 12 and a printed-circuit board 22 is placed on the bottom of the main frame 12 and has a shape that is a constituent feature of the present embodiment.

The main frame 12 consists mainly of a pair of side panels 12a and 12b, auxiliary panels 12c and 12d, guide panels 13a and 13b, and a metallic panel 12e. The side panels 12a and 12b are realized with lightweight metallic plates. The auxiliary panels 12c and 12d are attached to the rear edges of the side panels 12a and 12b, and realized with lightweight metallic plates. The guide panels 13a and 13b have the lower parts of the side edges thereof attached to the lower rear parts of the side panels 12a and 12b, realized with lightweight metallic plates, and shaped like the letter U, i.e., U-shaped. The guide panels 13a and 13b cover that back of the main frame 12. The recording paper 6 to be transported for printing is brought into contact with the guide panels 13a and 13b to be thus guided therewith. The metallic panel 12e is realized with a lightweight metallic plate. The metallic panel 12e is located with the side edges thereof fixed to auxiliary panels 12c and 12d, and placed in a space defined with the U-shaped guide panels 13a and 13b (inside the printer device). A thermal head driving mechanism 21 for driving the thermal head 20 is mounted on the metallic panel 12e.

One of the side panels, that is, the side panel 12b shown on the right-hand part of FIG. 2 has, as mentioned above, the ink cassette insertion port 2b through which the ink cassette 7 is inserted. A platen roller 14 is located with the ends thereof fixed to the side panel 12b and the other side panel 12a in the internal front space of the main frame 12. The platen roller 14 rotates while clamping the recording paper 6 in cooperation with the thermal head 20 so as to apply pressure required for printing to the recording paper 6, and thus transports the recording paper 6. A pinch roller 15 and a grip roller 40 (see FIG. 6) that are a pair of upper and lower rotary rollers for transporting the recording paper 6 needed for printing are located in front of the platen roller 14. A paper feed roller (or a rubber roller) 18 is located along the edge of the internal front space of the main frame 12 beyond the pair of rotary rollers 15 and 40 and the paper feed roller 18 are located with the ends thereof fixed to the front parts of the side panels 12a and 12b.

A recording paper/ribbon feeding mechanism 17 is mounted on the side panel 12a shown on the left-hand part of the drawing. The recording paper/ribbon feeding mechanism 17 drives the platen roller 14, pinch roller 15, grip roller 40, paper feed roller 18, ink ribbon feed reel 7b, and ink ribbon take-up reel 7c so as to rotate them.

Two motors, 16 and 19, are used as a driving source for the recording paper/ribbon feeding mechanism 17. One of the motors, that is, the motor 16 is a stepper motor responsible for all movements to be performed for feeding recording paper in the printer device, and capable of conveying torque to the grip roller 40. The magnitude of an angular motion to be made by the motor 16 can be controlled in order to adjust a magnitude of paper feed by means of a drive control means that is not shown. The other motor 19 is a DC motor that supplies torque to enable the ink cassette 7 to wind up an ink ribbon or enable the paper feed roller 18 to feed paper.

The stepper motor 16 is mounted on the inner surface of the auxiliary panel 12d attached to the rear edge of the side panel 12a. The stepper motor 16 is borne by a shaft of a gear 17a. The stepper motor 16 conveys torque to a rotation shaft of a gear 17f via a mechanism composed of another gear 17b meshed with the gear 17a, a timing belt 17c, a gear 17d, a timing belt 17e, and the gear 17f. Consequently, torque required for printing is conveyed to the grip roller 40 borne by the rotation shaft of the gear 17f.

On the other hand, the DC motor 19 is placed outside the side panel 12a, and supplies torque to the ink ribbon take-up reel 7c and paper feed roller 18 so as to enable the ink ribbon take-up reel 7c to wind up the ink ribbon and to enable the paper feed roller 18 to feed paper. The DC motor 19 conveys torque to the paper feed roller 18, which lies between the side panels 12a and 12b, via a gear mechanism 19a meshed with the rotation shaft of the motor 19. Thus, one sheet of recording paper 6 is fed from the paper feed cassette 5. Moreover, the motor 19 conveys torque to a rotational member 19b interlocked with the gear mechanism 19a. This causes the rotational member 19b to rotate the ink ribbon take-up reel 7c with which the rotational member 19b is engaged. Thus, the ink ribbon 7a is taken up for printing.

The thermal head 20 and thermal head driving mechanism 21 are located in the spaced defined with the U-shaped guide panels 13a and 13b lying between the auxiliary panels 12c and 12d. The thermal head 20 has an exothermic body formed on the front surface thereof opposed to the platen roller 14. The exothermic body sublimates the dyes on the ink ribbon 7a in the ink cassette 7 so that one screen image can be printed in colors on the recording paper 6 (thermal transfer recording paper). The thermal head 20 is attached to a support member 20a integrated with a rotation shaft 20b. With the rotation of the rotation shaft 20b, the thermal head 20 moves vertically. One side surface of the support member 20a is always constrained to move towards the thermal head driving mechanism 21 by means of a spring 20d. When the printer device stands by for printing or has completed printing, the rotation shaft 20b rotates to cause the thermal head 20 to move upwards due to the constraint given by the spring 20d. The rotation shaft 20b is borne by the auxiliary panels 12c and 12d that serve as the rear part of both side surfaces of the main frame 12.

The thermal head driving mechanism 21 includes a motor 21a that serves as a driving source for vertically moving the thermal head 20. The motor 21a is a DC motor and is located in the upper part of the space defined with the U-shaped guide panels 13a and 13b in the internal rear part of the main frame 12. The motor 21a is attached to the metallic panel 12e, which serves as the back panel of the main frame 12 and is fixed to the side panels 12a and 12b, with a pair of support members 21b between them. The motor 21a conveys torque via a gear 21c engaged with the rotation shaft of the motor 21a. This causes a first cam 21d that is attached to the rotation shaft of the motor 21a to rotate. The first cam 21d is engaged with a second cam 20c that is located at a right position on the support member 20a coincident with the position of the first cam 21d. The support member 20a supports the thermal head 20. When the support member 20a pivots with the rotation shaft 20b as a center, the thermal head 20 makes vertical movements needed for printing.

Moreover, a rotation shaft 21g rotates responsively to the movement of a member 21f engaged with a third cam 21e. The rotation of the rotation shaft 21g causes a slider 24 to move straight. The other end of the slider 24 is located inside the panel 12b and engaged with a rotational member 15a that bears the shaft of the pinch roller 15 to cause the pinch roller 15 to move in a predetermined direction. Owing to this structure, when the printer device operates for printing, the pinch roller 15 is moved in the predetermined direction responsively to the vertical movement of the thermal head 20. Moreover, the recording paper 6 clamped by the pinch roller 15 and grip roller 40 is brought into contact with or separated from the thermal head 20 responsive to the movement to be performed for feeding recording paper.

For accomplishing the aforesaid object of the present invention, the printer device 1 in accordance with the present embodiment has, as shown in FIG. 2, the printed-circuit board 22 interposed between the main frame 12 and body bottom 3. The printed-circuit board 22 has a shape optimal for realizing the compact and lightweight device of the printer device.

The structure and placement of the printed-circuit board, which are the constituent features of the present invention, and the layout of circuit elements mounted on the printed-circuit board will be described with reference to FIG. 3 to FIG. 5.

Figure 3:
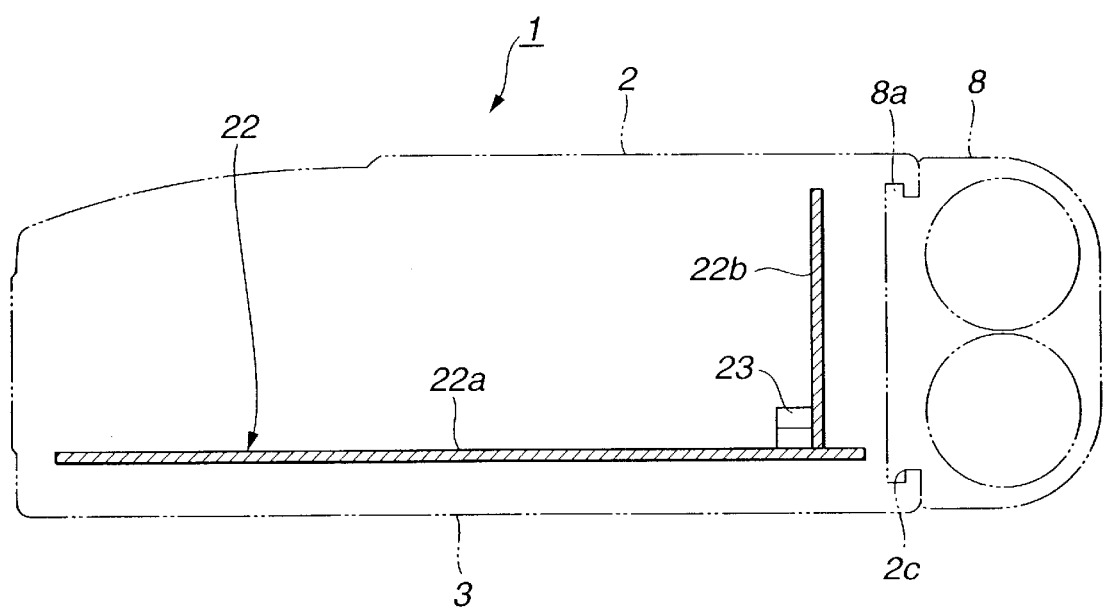
FIG. 3 is a sectional view of the printer device in accordance with the present invention showing the placement of printed-circuit boards in the printer device in accordance with the present invention.

FIG. 3 is a side view for explaining the concept of the printer device, showing the state of the printed-circuit board 22 placed in the printer device shown in FIG. 1. FIG. 4 and FIG. 5 are explanatory diagrams concerning the structure of the printed circuit board. FIG. 4 is a perspective view showing the structure of the printed-circuit board while viewing the printed-circuit board from the front side of the printer device. FIG. 5 is a perspective view showing the structure of the printed-circuit board while viewing the printed-circuit board from the rear side of the printer device.

The printed-circuit board 22 is, as shown in FIG. 3, placed on the bottom of the printer device 1. The printed-circuit board 22 consists of a control printed-circuit board 22a and a power printed-circuit board 22b. A group of circuits required for printing, for example, at least one of an IC 31a (see FIG. 4) for controlling paper feed and an IC 31b (see FIG. 4) for controlling ink ribbon feed is mounted on the control printed-circuit board 22a. The power printed-circuit board 22b is attached to the control printed-circuit board 22a so that the power printed-circuit board 22b will be placed along one side surface of the printer device 1. The power printed-circuit board 22b has battery contacts 34a (see FIG. 5) that are electrically joined with battery contacts 8b of the battery 8. The power printed-circuit board 22b includes a charge circuit element 37 capable of charging the battery 8 brought into contact with the battery contacts 34a. Thus, the battery that is essential to a portable device can be attached to the printer device, and the charge circuit for charging the battery is incorporated in the printer device. The printer device is therefore realized to be optimally portable.

The control circuit printed-circuit board 22a and power printed circuit board 22b are coupled to each other with one edge of the power printed-circuit board 22a with a connector 23 between them. The connector 23 serves as a coupling means and is mounted on a lower marginal part of the control circuit printed-circuit board 22a. The coupled printed-circuit boards are shaped substantially like the letter L, i.e., are L-shaped. When the connector 23 is used to couple the power printed-circuit board 22b to the control printed-circuit board 22a, the lower marginal part of the power printed-circuit board 22b may be directly inserted into the connector 23 in order to retain the L shape of the assembled printed-circuit boards. Alternatively, as shown in FIG. 3, both the printed-circuit boards 22a and 22b may have connectors. In this case, when the connectors are joined, the L shape of the assembled printed-circuit boards is retained.

The thus-structured printed-circuit board 22 is placed in the housing composed of the body cover 2 and body bottom 3 along the inner wall of the housing.

Figure 4:
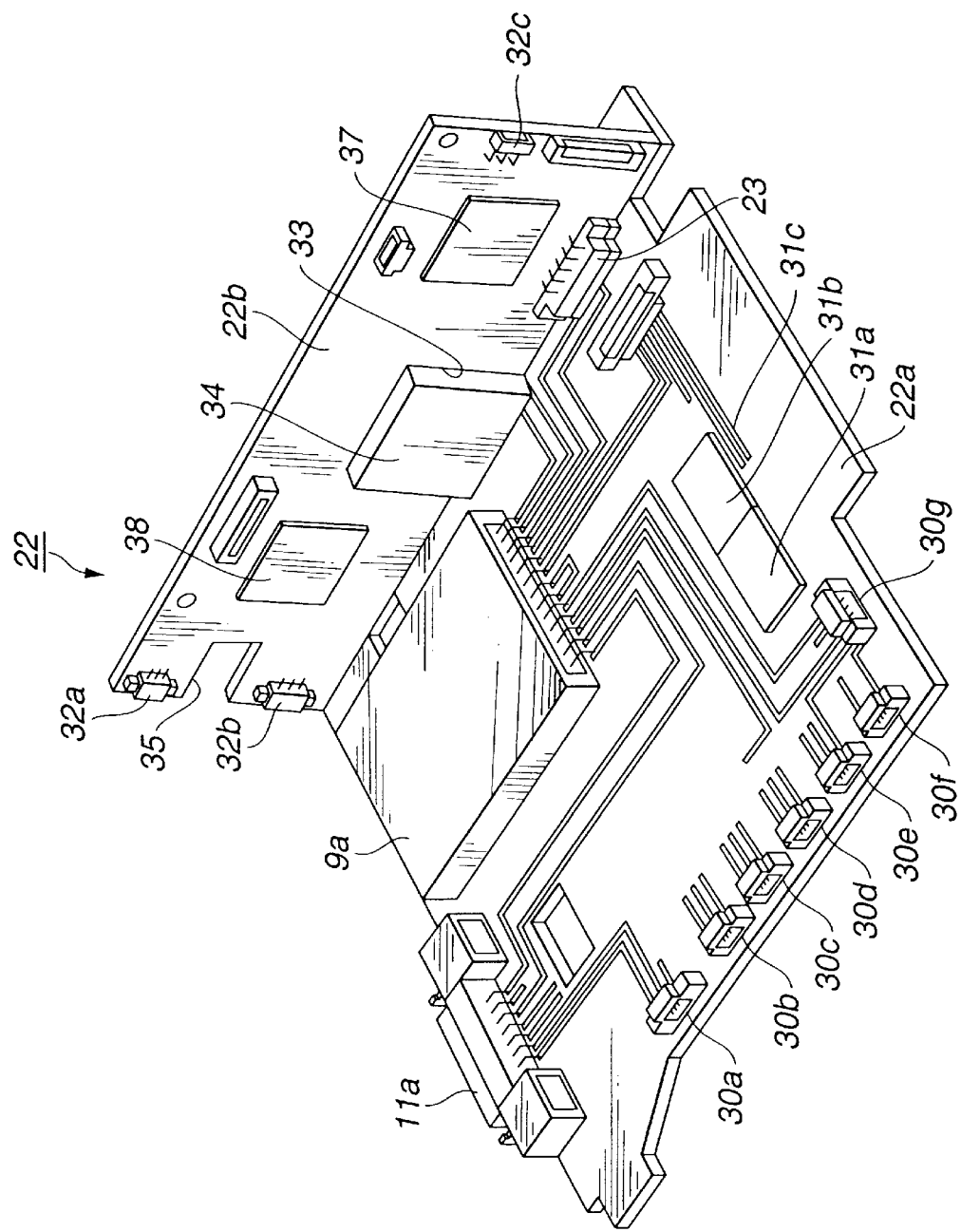
FIG. 4 is a perspective view showing the printed-circuit boards shown in FIG. 3 while viewing them from the front side of the printer device.

Moreover, a group of circuits required for printing, for example, the IC 31b for controlling the ink ribbon feed, and a video signal processing circuit that is not shown are, as shown in FIG. 4, mounted on the control printed-circuit board 22a included in the printed-circuit board 22 employed in the present embodiment. Moreover, a memory card connector 9a and a PC connector 11a are mounted along one side edge of the control printed-circuit board 22a. The memory card 9 is loaded in the memory card connector 9a so that it can be unloaded freely. The PC connector 11 is joined with the PC connector 11a so that it can be disjoined freely. Furthermore, a plurality of connectors 30a, 30b, 30c, 30d, 30e, 30f, and 30g through which various electronic components (not shown) incorporated in the printer device are connected to circuits is arranged along the front edge of the control printed-circuit board 22a.

The circuits and connectors are electrically connected to one another over a printed pattern 31c that is a pattern printed on the control printed-circuit board according to required routings of signals.

By the way, the power printed-circuit board 22b and the control printed-circuit board 22a are assembled in the shape of letter L using the connector 23. The circuit elements mounted on the power printed-circuit board 22b are electrically connected to various electronic parts mounted on the control printed-circuit board through the connector 23. The power printed-circuit board 22b has a notch 33 formed in the lower center thereof that borders the control printed-circuit board 22a. A joint member 34 including the batter contacts 34a that are electrically joined with the battery contacts 8b of the battery 8 is locked in the notch 33.

The charge circuit element 37 for charging the battery 8, the control IC 38 for controlling the thermal head 20 and thermal head driving mechanism 21, and others are mounted on the inner surface of the power printed-circuit board 22b. Furthermore, connectors 32a and 32b through which the circuit elements on the power printed-circuit board 22b are connected to the thermal head driving mechanism 21 and a large-scale capacitor (not shown) are mounted along one side edge of the power printed-circuit board 22b.

Figure 5:
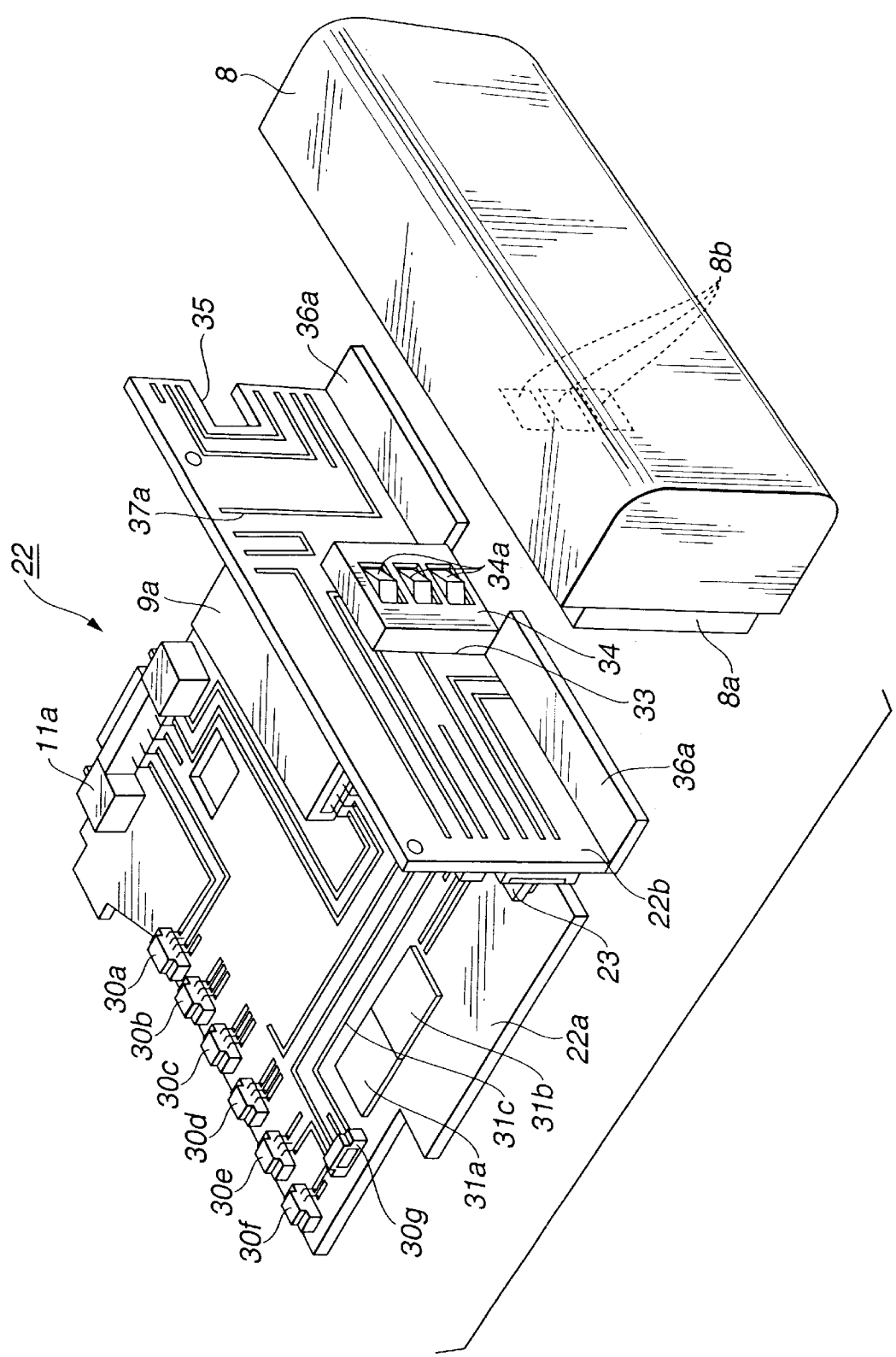
FIG. 5 is a perspective view showing the printed-circuit boards showing in FIG. 3 while viewing them from the rear side of the device.

The joint member 34, charge circuit element 37, and control IC 38 are, as shown in FIG. 5, electrically interconnected over a printed pattern 37a that is a pattern printed on the power printed-circuit board 22b according to required routings of signals.

At least three battery contacts 34a are, as shown in FIG. 5, projected from the outer surface of the joint member 34 locked in the lower center of the power printed-circuit board 22b. When the battery 8 is fitted in the battery attachment groove 2c in the body cover 2, the battery contacts 34a of the joint member 34 come into contact with the battery contacts 8b of the battery 8 so as to conduct. Consequently, power stored in the battery 8 is supplied to the body of the printer device 1.

As mentioned above, the printed-circuit board 22 incorporated in the printer device 1 in accordance with the present embodiment consists of the control printed-circuit board 22a and power printed-circuit board 22b that are assembled substantially in the shape of the letter L, i.e., are L-shaped. Furthermore, the control circuits including the circuits for controlling recording paper feed and controlling ink ribbon feed are mounted on the control printed-circuit board 22a placed on the bottom of the printed device. On the other hand, the circuit for driving the thermal head and the charge circuit that handle relatively high power are mounted on the power printed-circuit board 22b placed along the back surface of the printer device.

In other words, the power printed-circuit board 22b on which relatively large current flows is located near a large current source that is a component from which large current flows. Moreover, the charge circuit, the battery contacts 34a, and the control circuit for applying voltage to the thermal head 20 to heat the thermal head 20 are mounted and concentrated on the sole power printed-circuit board 22b. On the other hand, the control printed-circuit board 22a responsible for control of recording paper feed and control of ink ribbon feed that require only small current is located near a small current source, that is, an actuator (including the recording paper/ribbon feeding mechanism 17) needed for feeding the recording paper and ink ribbon. Moreover, the circuits for controlling recording paper feed and controlling ink ribbon feed are mounted and concentrated on the sole control printed-circuit board 22a. In the printer device 1, only the printed-circuit board 22 composed of the power printed-circuit board and control printed-circuit board and shaped like letter L is incorporated in order to realize the abilities of the printer device. The printed-circuit board 22 is a motherboard. This leads to the reduced lengths of routings of signals, and results in the compact and lightweight printer device. Thus, the printer device is optimally portable.

Since the printed-circuit board 22 is composed of the two printed-circuit boards 22a and 22b, the printed-circuit boards are manufactured mutually independently. This is advantageous in terms of a manufacturing process. Specifically, the printed-circuit boards can be assembled with the right part of the other substrate inserted directly into the connector. Before the assembling, the jobs of mounting electronic parts on the printed-circuit boards can be carried out separately. The assembling job is therefore simple. This greatly contributes to simplification of the manufacturing process and reduction in the cost of manufacturing.

Figure 6:
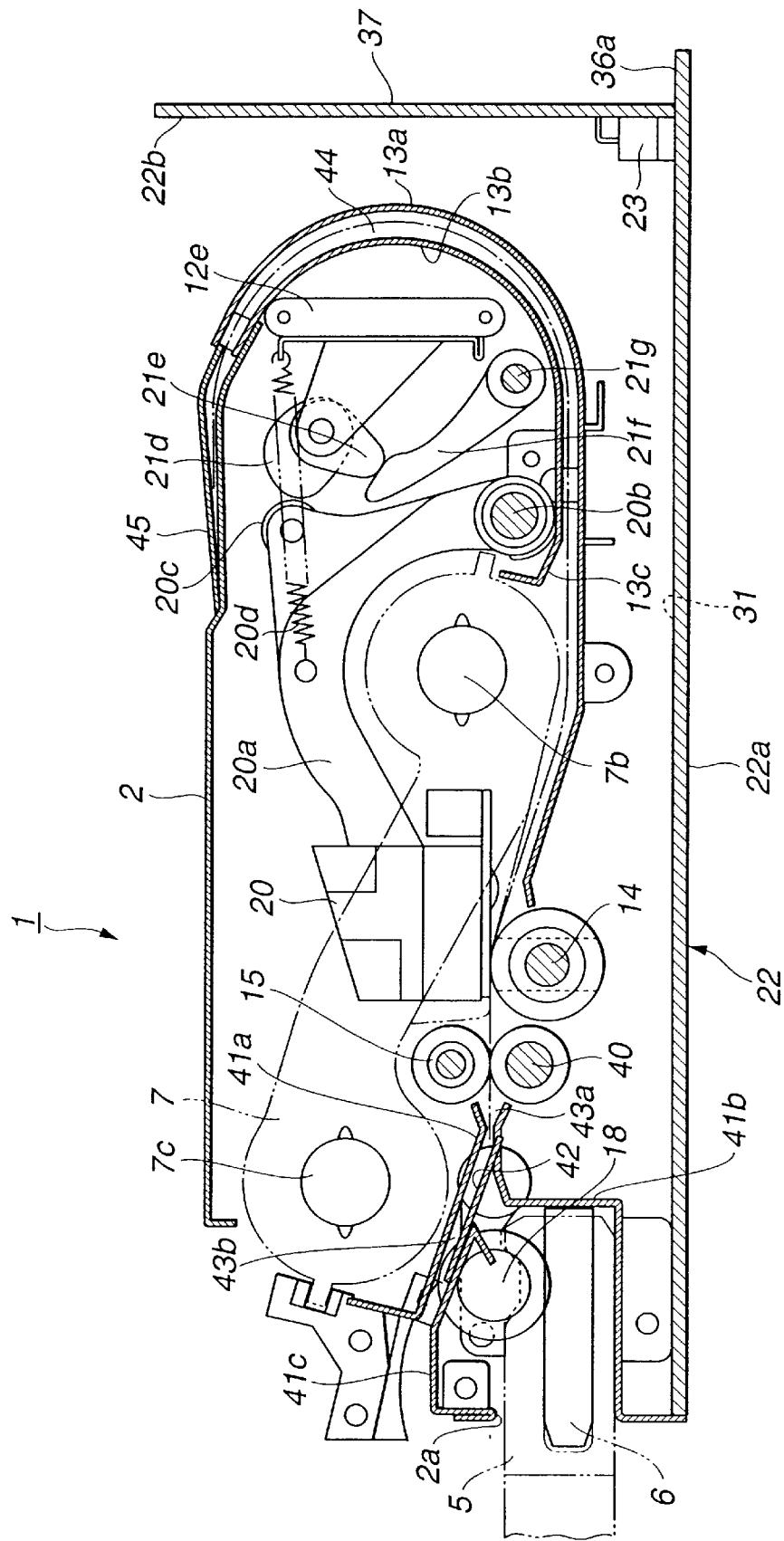
FIG. 6 is a sectional view of the printer device shown in FIG. 1.

FIG. 6 is a sectional view of a major portion of the printer device having the aforesaid printed-circuit board 22 actually incorporated therein. Movements to be made in the printer device in accordance with the present embodiment will be described in conjunction with FIG. 6.

To begin with, the topmost sheet of recording paper 6 stowed in the paper feed cassette 5 is fed to the interior of the printer device 1 by the paper feed roller 18. At this time, the recording paper 6 is smoothly fed with the rotation of the paper feed roller 18 because of the presence of a member having a curved surface at the proximal end of the paper feed cassette 5 inserted deeply in the printer device.

Guide plates 41a, 41b, and 41c that are attached to the main frame 12 in order to define recording paper transportation paths 43a and 43b are arranged in a stage preceding the stage in which the pinch roller 15 and grip roller 40 are located in the inner front space of the printer device. The recording paper 6 fed by the paper feed roller 18 passes through the transportation path 43a defined with the guide plate 41b while thrusting up a tape member 42 attached to the guide plate 41c. The recording paper 6 is thus transported towards the pinch roller 15 and grip roller 40. At this time, a sensor located near the recording paper transportation path defined with the guide plate 41b detects whether the recording paper 6 is normally transported, though the sensor is not shown. Depending on the result of detection, a major control unit mounted on the control printed-circuit board 22a determines whether printing should be started. If the recording paper is not transported normally, the control unit instructs display of an error indication of the like on a display unit 2e formed on the top of the body cover 2. Otherwise, control is given to drive components required for starting printing.

When printing is started, the recording paper 6 is clamped by the pinch roller 15 and grip roller 40. The IC 31a for controlling recording paper feed mounted on the control printed-circuit board 22a controls driving of the recording paper/ribbon feeding mechanism 17. Moreover, the grip roller 40 having an anti-slipping means applied to the surface thereof is driven to rotate. Consequently, transportation of the recording paper 6 for printing is controlled. In other words, transportation of the recording paper 6 is controlled so that the distal part of the recording paper 6 will be transported through the recording paper transportation path 44 defined with the guide panels 13a and 13b. At this time, the rear part of the recording paper 6 reaches a printing start point between the thermal head 20 and platen roller 14.

During printing, since the grip roller 40 and pinch roller 15 rotate, the recording paper 6 and ink ribbon 7a are fed while being pressed by the thermal head 20 and platen roller 14. While the recording paper is being fed, the control circuit mounted on the power printed-circuit board 22b causes current to flow into the exothermic body of the thermal head 20. Consequently, the thermal transfer inks on the ink ribbon 7a are dissolved or sublimated and transferred onto the recording paper 6. Printing is thus achieved. Moreover, during the printing, the circuit for controlling ink ribbon feed controls feed off the ink ribbon 7a required for printing.

In this case, for transferring the first ink of yellow (Y) on the ink ribbon 7a onto the recording paper 6, the pinch roller 15 and grip roller 40 feed the recording paper 6 to the left-hand part of the drawing. The recording paper 6 and ink ribbon 7a are fed while being pressed by the thermal head 20 and platen roller 14. An image information signal representing yellow(Y) is applied to the exothermic body (not shown) of the thermal head 20.

At this time, the distal part of the recording paper 6 runs through the recording paper transportation path 44 defined with the U-shaped guide panel 13a and the U-shaped guide panel 13b placed inside the guide panel 13a. On the other hand, the rear part of the recording paper 6 passes through the transportation path 43a, thrusts down the tape member 42 attached to the guide plate 41c, and reaches the recording paper transportation path 43b. Meanwhile, the first color ink is transferred.

The position of the thermal head 20 for printing can be selected from among three positions. The three positions, for example, an upper position, a lower position at which the thermal head is located in the drawing, and an intermediate position that is referred to as a partial position and at which the thermal head stands by are switched by the thermal head driving mechanism 21. Depending on a printing mode, the position of the thermal head 20 is controlled by the control IC 38 mounted on the power printed-circuit board 22b.

After transferring the first color ink of yellow (Y) onto the recording paper 6 is completed, the control IC 38 gives control to drive the thermal head driving mechanism 21. Consequently, the thermal head 20 is parted from the platen roller 14 and moved to the partial position. Furthermore, the pinch roller 15 and grip roller 40 feed back the recording paper 6 to the rear part of the printer device 1 (to the right-hand part of the drawing). The aforesaid movements are repeated in order to transfer the second color ink of magenta (M), the third color ink of cyan (C), and the transparent overcoat (OP) onto the recording paper 6 in that order. Thus, color printing is achieved.

The recording paper 6 is kept to the rear part of the printer device 1 (to the right-hand part of the drawing) by the grip roller 40 and pinch roller 15 until transfer of color inks is started. At this time, the distal part of the recording paper 6 is fed while being guided by the recording paper transportation path 44 defined with the U-shaped guide panels 13a and 13b. The sensor that is not shown detects the rear part of the recording paper 6. The rotation of the pinch roller 15 and grip roller 40 is controlled based on the result of detection, whereby the rear part of the recording paper 6 is set at the printing start point between the thermal head 20 and platen roller 14.

When transfer of all color inks is completed, the printed recording paper 6 is ejected to outside the printer device through the recording paper transportation path 43b by means of a paper feed mechanism that is not shown and that ejects paper. Printing is thus completed.

According to the present embodiment, the power printed-circuit board 22b on which large current flows is located near a large current source. Moreover, the charge circuit, the battery contacts 34a, and the control circuit for applying voltage to the thermal head 20 so as to heat the head are mounted and concentrated on the sole power printed-circuit board 22. The control printed-circuit board 22a responsible for control of recording paper feed and control of ink ribbon feed, which require only small current, is located near a small current source, that is, an actuator needed for feeding the recording paper and ink ribbon (including the recording paper/ribbon feeding mechanism 17). The circuits for controlling recording paper feed and controlling ink ribbon feed are mounted and concentrated on the sole control printed-circuit board 22a. In the printer device 1, only the printed-circuit board 22 composed of the two printed-circuit boards and shaped like the letter L, i.e., are L-shaped, need be incorporated in order to realize the abilities of the printer device. The printed-circuit board 22 is a mother board. This results in a compact and lightweight printer devices, and enables provision of a printer devices that is optimally portable.

Since the printed-circuit board 22 is composed of the two printed-circuit boards 22a and 22b, the printed-circuit boards 22a and 22b can be manufactured mutually independently and assembled easily. This is advantageous in terms of a manufacturing process for the printed-circuit board. Besides, the manufacturing process can be simplified. This greatly contributes to reduction in the cost of manufacturing.

The present invention is not limited to the aforesaid embodiment. The applications of the embodiment are encompassed by the present invention.

As described so far, according to the present invention, a printer device can be designed to be compact and lightweight, and thus realized to be optimally portable. Moreover, since the printed-circuit board 22 employed in the printer device 1 has an easy-to-manufacture structure, the manufacturing process ban be simplified. This greatly contributes to reduction in the cost of manufacturing.

What is claimed is:

1. A printer device, comprising:

a housing having a bottom and a top and side and end walls arranged transverse to said bottom and said top;

a control printed circuit board having one surface placed upon and lying along said bottom and having a control circuit for controlling at least one of paper feed and ink ribbon feed;

a separate power printed circuit board having one surface positioned to lie along one of said side surfaces and including a charge circuit for charging an external rechargeable battery when brought into contact with battery contacts connected to the charge circuit, said power printed circuit board and said control printed circuit board being aligned transverse to one another; and coupling means for electrically coupling circuitry on said control printed circuit board with circuitry on said power printed circuit board.

2. A printer device according to claim 1, wherein:

said control printed circuit board and said power printed circuit board are coupled to each other by said coupling means to join one edge of said control printed circuit board with one edge of said power printed circuit board; and said circuit boards being arranged so as to substantially form an L-shaped configuration.

3. A printer device according to claim 1, wherein said coupling means is a connector mounted on one of said printed circuit boards and an edge of the other printed circuit board is directly inserted into said connector.

4. A printer device according to claim 1, wherein the coupling means comprises joining connectors mounted on said printed circuit boards for coupling the control circuit and the power circuit.

5. A printer device according to claim 1, wherein said power printed circuit board is located along a back surface of said printer device.

6. A printer device according to claim 1 wherein the power printed circuit board includes a control circuit for controlling a thermal head.

7. A printer device according to claim 6, wherein said thermal head is located near said top, and an actuator means for feeding one of paper or ink ribbon is located near said bottom and between said thermal head and said bottom.

8. A printer, comprising:

a printing device;

an elongated a guide assembly for guiding a sheet during a printing operation;

one portion of the guide assembly being substantially straight and another portion thereof being substantially U-shaped;

a control printed circuit board being arranged between said guide assembly straight portion and a bottom surface of a printer housing and including control circuitry for controlling one of a paper feed and an ink ribbon feed;

a power printed circuit board aligned transverse to said control printed circuit board and positioned between the U-shaped portion of the guide assembly and a side surface of said housing adjacent to said bottom surface; and coupling means for coupling circuitry on said power printed circuit board to circuitry on said control printed circuit board.

9. In the printing device of claim 8, the power printed circuit board further comprising a charge circuit for charging a rechargeable battery located exterior to said housing and brought into contact with battery contacts of the charge circuit.

* * * * *

UNITED STATES PATENT AND TRADEMARK OFFICE
CERTIFICATE OF CORRECTION

PATENT NO.         : 6,618,068 B2                                          Page 1 of 1
APPLICATION NO. : 09/804274
DATED              : September 9, 2003
INVENTOR(S)        : Kazuhide Ishikawa It is certified that error appears in the above-identified patent and that said Letters Patent is hereby corrected as shown below:

ON THE TITLE PAGE

At item (75) on the Title page, delete "Mitaka" and insert therefor --Tokyo--.

In claim 8, column 14, line 17, after the word "elongated" and before the word "guide", delete "a".

Signed and Sealed this

Fourth Day of September, 2007

JON W. DUDAS
*Director of the United States Patent and Trademark Office*